United States Patent [19]
Reis et al.

[11] Patent Number: 4,673,100
[45] Date of Patent: Jun. 16, 1987

[54] EQUIPMENT ENCLOSURE FASTENING MEANS

[75] Inventors: Mario J. J. M. P. D. Reis; John Couper, both of West Lothian, Scotland

[73] Assignee: Burroughs Corporation, Detroit, Mich.

[21] Appl. No.: 883,531

[22] Filed: Jul. 9, 1986

[30] Foreign Application Priority Data

Oct. 25, 1985 [GB] United Kingdom ............... 8526400

[51] Int. Cl.$^4$ ............................................ B65D 45/16
[52] U.S. Cl. .................................... 220/324; 220/284
[58] Field of Search ............................... 220/284, 324

[56] References Cited

U.S. PATENT DOCUMENTS

| | | | |
|---|---|---|---|
| 3,121,480 | 2/1964 | Goettl et al. | 220/324 |
| 3,361,283 | 1/1968 | Nicholson | 220/324 |
| 4,462,142 | 7/1984 | Hickling | 220/324 |

FOREIGN PATENT DOCUMENTS

| | | |
|---|---|---|
| 1352283 | 5/1974 | United Kingdom . |
| 1506127 | 4/1978 | United Kingdom . |
| 2104589 | 3/1983 | United Kingdom . |

*Primary Examiner*—George T. Hall
*Attorney, Agent, or Firm*—Mark T. Starr

[57] ABSTRACT

Disclosed is an equipment enclosure allowing service personnel easy access to equipment housed within the enclosure. The enclosure employs two case portions, each provided with a respective plurality of mating catch mechanisms for holding the two case portions together. The catch mechanisms allow the case portions to be joined and locked together by a simple, one movement action. The enclosure is opened by the cocking of each of the one or more individual catch mechanisms which then remain cocked, thereby allowing the removal of the case portions.

24 Claims, 9 Drawing Figures

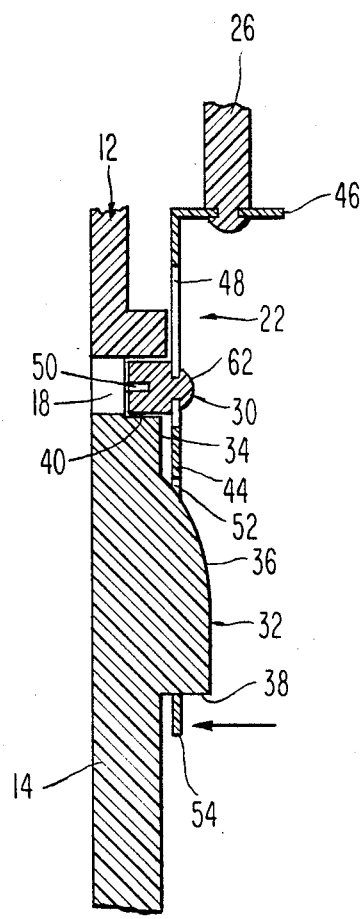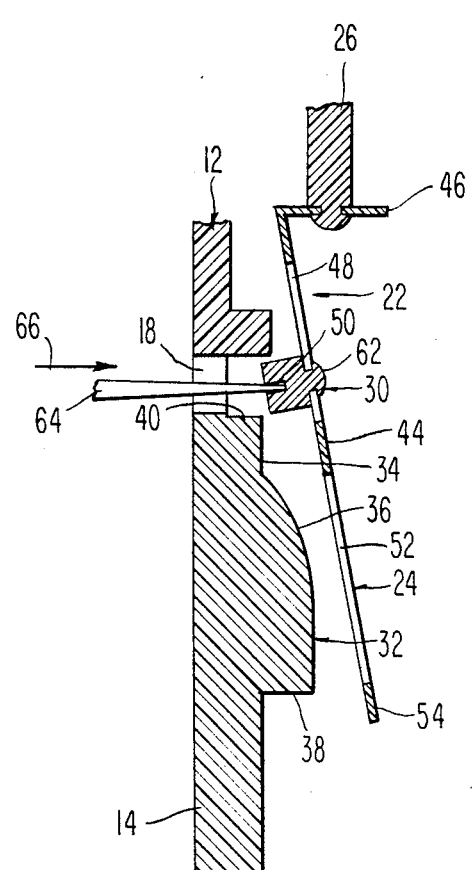

EQUIPMENT ENCLOSURE FASTENING MEANS

BACKGROUND OF THE INVENTION

The present invention relates to equipment enclosures and most particularly relates to such enclosures used for electrical, electronic and electro-mechanical equipment where ease of access for servicing, repair and maintenance is desirable and essential.

With increasing complexity in electronic and electro-mechanical equipment, regular maintenance, servicing and repair becomes essential, employing the services of skilled service engineers whose time and thereby cost must be kept at a minimum. The complexity of modern electronic electrical, and electro-mechanical equipment means that in opening a case or equipment enclosure the technician or engineer may be required simultaneously to manipulate many catches and cable harnesses. The difficulty attendant upon such plural, simultaneous operations needlessly extends the time required to service a machine.

In assembly of electrical, electro-mechanical or electronic equipment a considerable proportion of the cost consists in the labor expense. The many catches and attachment devices provided in modern equipment cases and the difficulty of their operation adds needlessly to the assembly cost of equipment.

It is therefore desirable to provide an equipment enclosure which comes together to enclose the equipment in a simple, one-movement action but which may be opened by the "cocking" of one or more individual catches which then remain cocked allowing the removal of the equipment enclosure covers.

SUMMARY OF THE INVENTION

The present invention consists in an enclosure for holding equipment in its interior, said enclosure being openable to provide access to the equipment by separation of first and second attached case portions, said first case portion including a first retaining clip portion on an interior surface thereof and said second case portion including an elastic arm in association with an interior surface thereof, said elastic arm being displacable, as said enclosure is closed, away from said interior surface of said second case portion for said first clip portion to engage and be held in a second clip portion on said elastic arm, where said second case portion includes an aperture and where said elastic arm includes means, operative when urged towards said interior of said enclosure through said aperture, to urge said elastic arm towards said interior to disengage said first and second clip portion and to maintain said first and second clip portions disengaged until said first and second case portions are moved apart.

In a preferred embodiment, an equipment enclosure comprises a top cover and a base. The top cover and the base are joined together along a line of join to form the enclosure. The base is provided with apertures for activating each of a plurality of retaining catch mechanisms. The retaining catch mechanism in each instance comprises an elastic spring arm having a recess in the form of a void therein operative to pass over a boss in the top cover as the enclosure is closed. The boss preferably comprises a first side with a shallow slope and a second side with a steep or sheer slope such that a cross member at the distal end of the elastic spring arm is urged towards the interior of the enclosure as the enclosure is closed by the first side having a shallow slope and thereafter passes behind the boss on the steep or sheer second side to be retained by the boss and thereby hold the enclosure in a shut position.

The elastic spring arm in the preferred embodiment also comprises a slot running towards and away from the top cover wherein a wedge is slidably mounted. When it is desired to open the enclosure, a screwdriver or similar instrument is pushed through the aperture in the base to engage the wedge and the wedge is pushed upwards to engage the boss. As the top cover is removed, the wedge prevents the cross member from falling back behind the boss on the steep or sheer slope of the second side and allows it instead only to fall on the shallow slope first side thereby allowing the continued opening of the enclosure.

DESCRIPTION OF THE DRAWINGS

The present invention is further described in greater detail by way of an example by the following description taken in conjunction with the appended drawings in which;

FIG. 7 shows the final stage in the closing of the enclosure.

FIG. 8 shows the first stage in opening of a closed enclosure, and

DESCRIPTION OF THE PREFERRED EMBODIMENT

Figure 1:
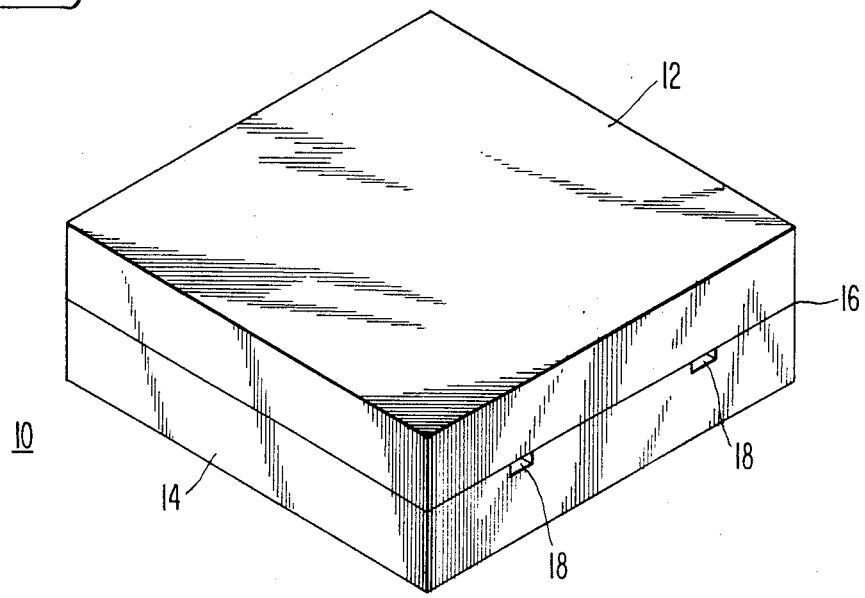
FIG. 1 shows an isometric projected view of a closed equipment enclosure according to the present invention.

FIG. 1 shows the enclosure 10 comprising a top cover portion 12 and a base portion 14 joined together along a central separation 16 and held in association one with the other to form the enclosure 10. The base portion 14 is provided with apertures 18 used, in a manner later to be described, to allow the opening of the enclosure 10.

Figure 2:
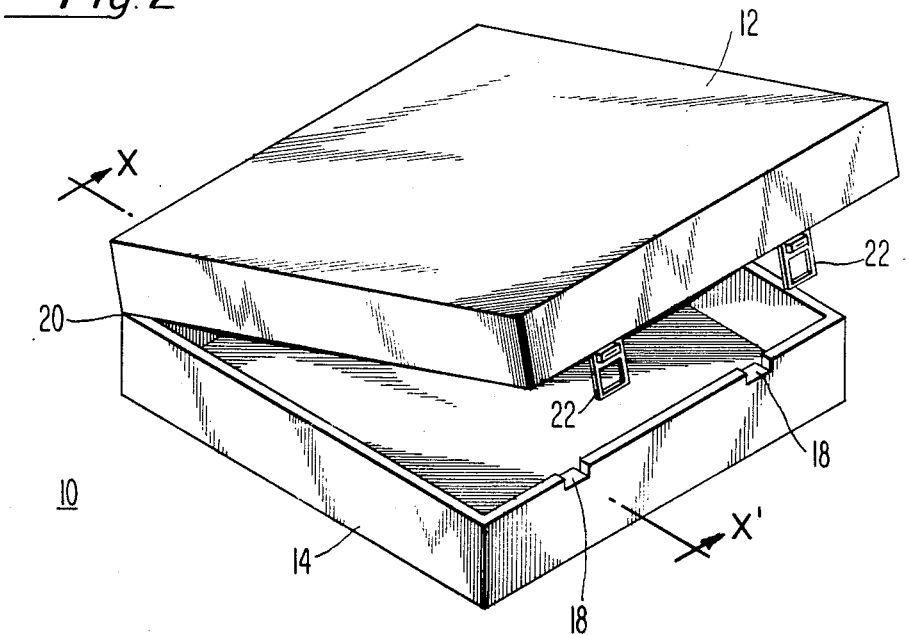
FIG. 2 shows an isometric projected view of the equipment enclosure of FIG. 1 in partially open position.

FIG. 2 shows the enclosure 10 of FIG. 1 in a partially opened position. The top cover portion 12 is here shown as being hinged at one side 20 against the base portion 14. This is shown for preference only and it is to be understood that the top cover portion 12 can equally well lift straight up from the base portion 14. The top cover 12 is provided with a retaining catch mechanism 22 for each aperture 18 in the base portion 14. The apertures 18 are provided in the top surface 15 of the upright walls of the base portion 14.

Figure 3:
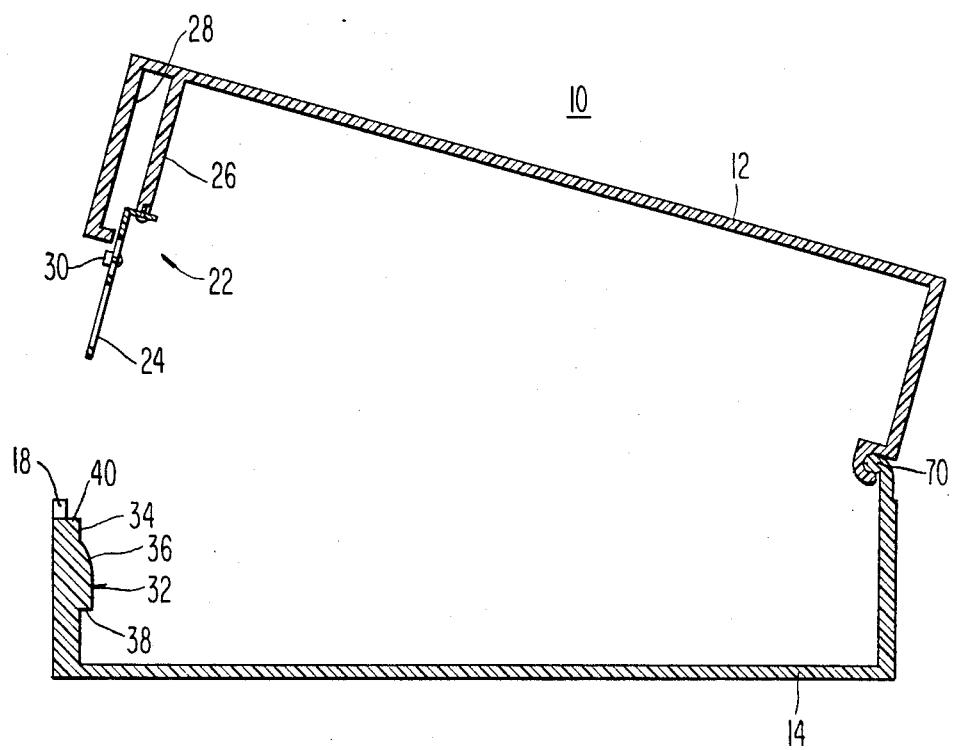
FIG. 3 shows a cross section of the partially opened equipment enclosure of FIG. 2 taken along the line X—X' and looking in the direction of the arrows.

FIG. 3 shows a cross-sectional view along the line X—X' of FIG. 2 looking in the direction of the arrows of the partially open enclosure.

The retaining catch mechanism 22 comprises an elastic spring arm 24 mounted on a pillar 26 inside the top cover portion 12 proximate to an inner surface 28 of the top cover portion 12. A wedge 30, whose function is later to be described, is provided attached to the elastic spring arm 24.

The base portion 14 comprises a boss 32 in turn having a ledge portion 34, a first side 36 of shallow slope and a second side 38 of steep slope. In this preferred embodiment, the steep slope is a sheer slope for engaging the elastic spring arm in a manner later to be described. The base portion 14 further comprises a sheer edge 40 to the ledge portion 34 closest to the top cover portion 12 for engaging the wedge 30, again in a manner later to be described.

Figure 4:
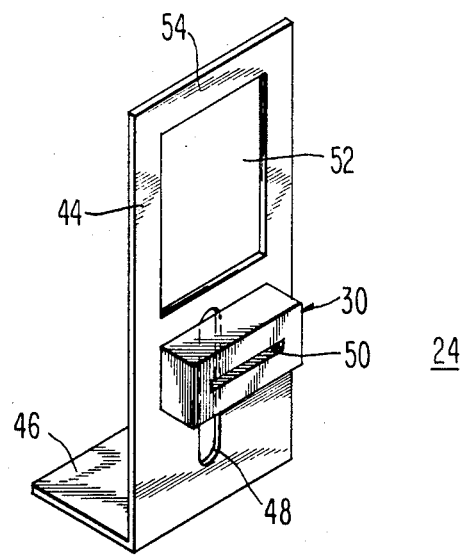
FIG. 4 shows an isometric projected view of the spring clip assembly of FIGS. 2 & 3.

FIG. 4 shows in detail the elastic spring arm 24 of FIGS. 2 & 3. The elastic spring arm 24 comprises a catch portion 44 and a mounting portion 46 for affixing the elastic spring arm 24 to the pillar 26.

A slot 48 is provided in the catch portion 44 of the elastic spring arm 24 in that part thereof proximate to the pillar 26 and holds the wedge 30. In a manner better shown in FIGS. 5-9, the wedge is held in the slot to slide to-and-fro therein. The wedge 30 comprises a screwdriver slot 50 for use in opening the enclosure 10 in a manner later to be described.

A void or recess 52 is provided as a cutaway portion in the catch portion 44 of the elastic spring arm 24 which allows the boss 32 to enter and be retained in the catch portion 44 of the elastic spring arm 24. The void or recess 52 leaves a cross member 54 at that end of the catch portion 44 nearest to the base portion 14 of the enclosure 10.

Figure 5:
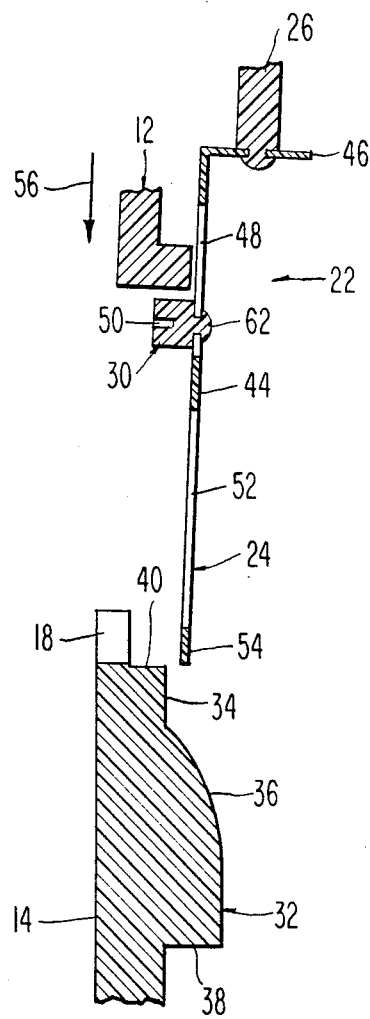
FIG. 5 shows in enlarged cross-sectional detail the first stage of operation of the clip and boss assembly used in the enclosure of FIGS. 1-4, FIG. 5 showing the first stage of closure of the enclosure.

FIG. 5 shows the first stage in closing of the enclosure 10, FIG. 5 showing an enlarged cross-sectional view of the catch mechanism 22 and boss 32 of FIG. 3.

As the enclosure 10 is closed so the base portion 14 and the top portion 12 of the enclosure 10 approach one another as indicated by the first arrow 56. The cross member 54 first passes over the ledge portion 34 of the boss 32 prior to engaging the first side 36 of shallow slope of the boss 32.

Figure 6:
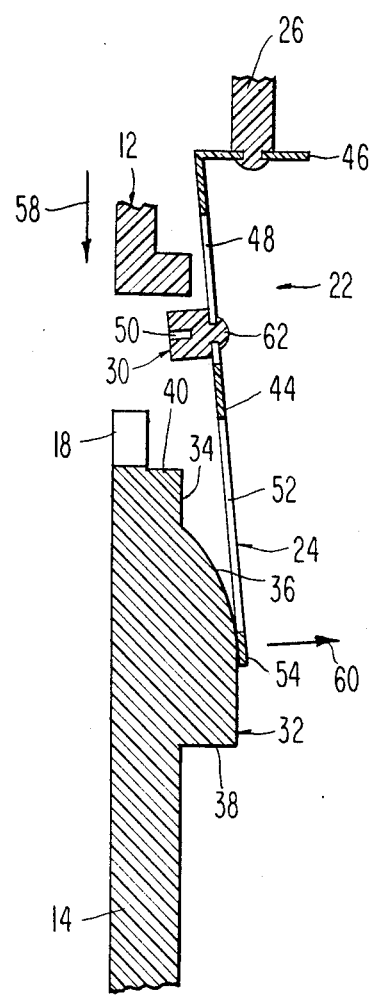
FIG. 6 shows a second stage in the sequence of operations commencing with FIG. 5 leading to the closure of the enclosure.

FIG. 6 shows the second stage of closing of the enclosure 10. Movement together of the base portion 14 and the top cover portion 12 continues as indicated by the second arrow 58, the cross member 54 of the catch portion 44 of the elastic spring arm 24 engaging the first side 36 of the boss 32 for the shallow slope thereof to urge the catch portion 44 of the elastic spring arm 24 towards the interior of the enclosure 10 as indicated by a third arrow 60. The furthest extremity of movement of the catch portion 44 of the elastic spring arm is insufficient to cause the wedge 30 to jam against any part of the casing 12,14 of the enclosure.

FIGS. 5 & 6 both show how the wedge 30 is held in the slot 48 by means of a lug 62. The wedge 30 can be held in the slot 48 by any means other than the lug 62 retaining it in the slot 48 and allowing movement of the wedge 30 to-and-fro in the slot 48 in the fixed attitude shown in FIG. 4.

FIG. 7 shows the third and final stage of operation of the catch mechanism 32,22 as the enclosure 10 is closed. As the cross member 54 passes completely over the first side 36 of the boss 32 so it falls onto the second side 38 with its very steep or sheer slope with the boss protruding through the void or recess 52 on the catch portion 44 of the elastic spring arm 24. The sheer edge 40 to the ledge portion 34 of the boss 32 engages the wedge 30 moving it along the slot 48 for the wedge 30 to lie precisely in the aperture 18 when the enclosure 10 is closed. The size of the wedge 30 is chosen completely to fill the aperture 18 to provide an adequate and positive seal against ingress of foreign matter into the closed enclosure. The catch portion 44 of the elastic spring arm 24 returns to its original unstressed position otherwise shown in FIG. 5.

FIG. 8 shows the first stage in opening of the catch mechanism 32,22 of the enclosure 10 when the enclosure 10 is closed. A screwdriver or other sharp instrument 64 is inserted as indicated by a fourth arrow 66 into the aperture 18 to engage the screwdriver slot 50 on the wedge 30 which in turn urges the elastic spring arm catch portion 44 clear of the boss 32 such that the cross member 54 is pushed clear of the second side 38 of the boss 32.

Figure 9:
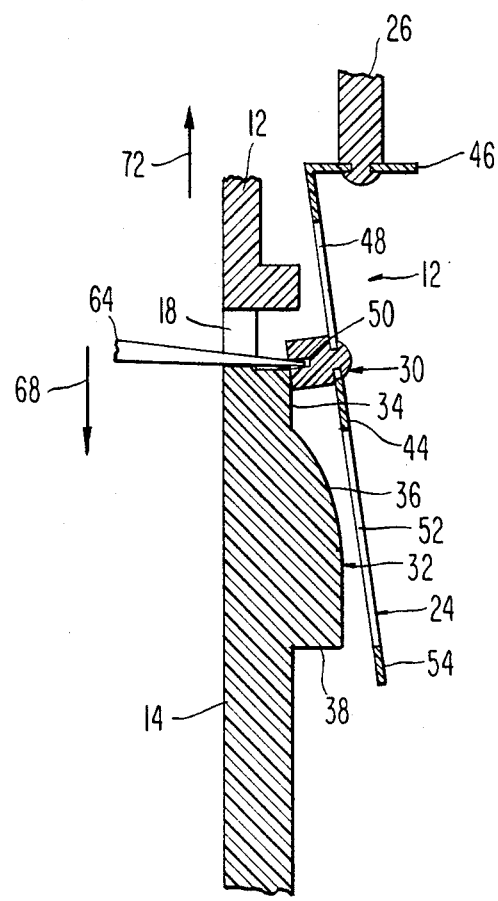
FIG. 9 shows the final stage in the opening of a closed enclosure.

FIG. 9 shows the second and final stage of the opening operation of the catch mechanism 22,32 of the enclosure 10. The screwdriver 64 is urged as indicated by a fifth arrow 68 to move the wedge 30 to sit upon the ledge portion 34 of the boss 32 thus maintaining the elastic spring arm catch portion 44 in a position where the cross member 54 is clear of the second side 38 of the boss 32. The wedge 30 is capable of maintaining the catch portion 44 of the elastic spring arm 24 in this position for an indefinite period. First the person wishing to open the enclosure 10 may go around all of the catch mechanisms 22,32 in turn on the enclosure 10 placing them into the cocked or "ready to open" position shown in FIG. 9, then he or she can withdraw the top portion 12.

Returning briefly to FIG. 3, the enclosure is shown as comprising a hinge 70 on that portion furthest away from the catch mechanism 32,22. It is to be appreciated that any other means of attachment may be used other than the hinge and it is preferred that catch mechanisms 32,22 be used in all parts of the cover. However those skilled in the art will be aware of many other variants and mixtures of catches which may be used in combination with the catch mechanism 22,32 described in this present application.

Returning once again to FIG. 9, the catch mechanism 22,32 having been placed in the cocked position indicated at each location where it occurs in the enclosure 10, and the screwdriver 64 or other sharp object having been removed from each aperture 18, the top cover portion 12 is withdrawn as indicated by a sixth arrow 72. In the withdrawal of the top cover portion 12, the wedge 30 maintains the catch portion 44 clear of the boss 32 for a sufficient distance that the cross member 54 falls onto the first side 36 of the boss 32 where its direction and shallowness of slope does not prevent separation of the two portions 12,14 of the enclosure.

Thus the operator wishing to open the enclosure merely has to go round each catch in turn to cock the catch and then lift the cover portion 12 in a single operation clear of the base portion 14. The person wishing to open the enclosure 10 thus is free to do any of the other things which may be necessary with regard to the equipment inside the enclosure for the enclosure properly to be opened.

Whereas the enclosure 10 has hereinbefore been described as having elastic spring catch mechanisms 22,24 on the top cover portion 12 and the boss 32 on the base portion 14, it is to be understood that these positions can be reversed without change to the present invention. Further, it is to be appreciated that the boss 32 may be of a shape other than that shown in the FIGURES without detracting from its holding function within the void or recess 52 in the spring clip catch portion 44.

Equally, it is to be understood that the boss might be provided on the elastic spring arm catch portion 44 and the recess or void provided in the wall of the base portion 14. The boss 32 and the void or recess 52 together provide first and second portions of a clip mechanism. The cross member 54 and the boss 32 may separately be caused to co-operate independently of the action of a two-part catch mechanism without detracting from the operation of the present invention. In particular, it is envisaged that the catch mechanism might include a pin and a hole, the pin engaging the hole as the elastic spring arm catch portion 44 falls down over the boss 32 and the pin or hole being held clear of the boss for separation of the top cover portions and the base portion. The pin can be provided on the inner surface of the base portion and the hole wherethrough it passes be provided on the elastic spring arm 24,44.

Equally, in the present invention, while the elastic spring arm 24 has been shown as a flexible arm made of elastic material such as tempered steel or resilient polymer material, it may equally well be fabricated as a rigid hinged unit restored in its position by a separate helical or leaf-spring.

The wedge 30 can be of any shape suitable to allow performance of its described function. The wedge 30 can be provided with means allowing direct manual access thereto without use of a screwdriver 64 or other sharp instrument.

The void or recess 52 rather than being provided as hereinbefore described as a cutaway portion of discontinuous surface on the spring arm 24 can equally be provided as a molded or pressed continuous surface adapted to receive the boss 32.

We claim:

1. An enclosure for holding equipment in its interior, said enclosure being openable to provide access to the equipment by separation of first and second attached case portions, said first case portion including a first retaining clip portion on an interior surface thereof and said second case portion including an elastic arm in association with an interior surface thereof, said elastic arm being displacable, as said enclosure is closed, away from said interior surface of said second case portion for said first clip portion to engage and be held in a second retaining clip portion on said elastic arm, where said first case portion includes an aperture and where said elastic arm includes means, operative when urged towards said interior of said enclosure through said aperture, for urging said elastic arm towards said interior to disengage said first and second clip portions, said means further for maintaining said first and second clip portions disengaged until said first and second case portions are moved apart.

2. An enclosure according to claim 1 wherein said means includes a wedge movable affixed to said elastic arm, said wedge being movable, after said urging towards said interior, between said second clip portion and said elastic arm.

3. An enclosure according to claim 2 wherein said first clip portion includes a boss and wherein said second clip portion includes a recess for receiving said boss.

4. An enclosure according to claim 3 wherein said boss is operative to engage said elastic arm to cause said urging of said elastic arm towards said interior as said enclosure is closed.

5. An enclosure according to claim 4 wherein said boss includes a first side having a shallow slope and a second side having a steep slope and wherein said elastic arm comprises a cross member defining a boundary of said recess, said cross member being operative to engage said first side of said boss as said enclosure is closed to urge said elastic arm towards said interior, to engage said second side of said boss to retain said boss in said recess, and to engage said first side of said boss as said first and second case portions are moved apart to prevent said boss from re-entering said recess.

6. An enclosure according to claim 5 wherein said elastic arm comprises a slot directed towards and away from the position occupied by said first case portion when said enclosure is closed, said wedge being affixed to move within said slot.

7. An enclosure according to claim 6 wherein said elastic arm is a flat spring arm and wherein said recess is a portion cut out therefrom.

8. An enclosure according to claim 7 wherein said cross member is that residual portion of said flat spring arm remaining after removal of said cut out portion and nearest to said first case portion when said enclosure is closed.

9. An enclosure according to claim 8 wherein said elastic arm is a metallic spring arm.

10. An enclosure according to claim 1 wherein said first clip portion includes a boss and wherin said second clip portion includes a recess for receiving said boss.

11. An enclosure according to claim 10 wherein said elastic arm is a flat spring arm and wherein said recess is a portion cut out therfrom.

12. An enclosure comprising:
   a first case portion including a first clip portion on an interior surface thereof;
   a second case portion including an elastic arm in association with an interior surface thereof;
   a second clip portion provided on said elastic arm;
   displacing means, provided on the interior surface of said first case portion, for displacing said elastic arm away from said interior surface of said second case portion as said enclosure is closed, said displacing means further for causing said first clip portion to engage said second clip portion; and
   wherein said elastic arm includes release means, responsive to being urged towards the interior of said enclosure through an aperture in said first case portion, for disengaging said first and second clip portions, said release means further for maintaining said first and second clip portions disengaged.

13. The enclosure according to claim 12 wherein said release means includes a wedge movably affixed to said elastic arm.

14. The enclosure according to claim 13 wherein:
   said first clip portion includes a boss; and
   said second clip portion includes a recess for receiving said boss.

15. The enclosure according to claim 14 wherein said boss is positioned to engage said elastic arm to cause said displacing of said elastic arm away from said interior surface of said second case portion as said enclosure is closed.

16. The enclosure according to claim 15 wherein:

said boss includes a first side having a shallow slope and a second side having a steep slope; and said elastic arm includes a cross member defining a boundary of said recess, said cross member being operative to engage said first side of said boss as said enclosure is closed whereby said elastic arm is urged away from said interior surface of said second case portion, to engage said second side of said boss to retain said boss in said recess, and to engage said first side of said boss as said first and second case portions are moved apart to prevent said boss from reentering said recess.

17. The enclosure according to claim 16 wherein said elastic arm includes a slot, said wedge being affixed to move within said slot.

18. The enclosure according to claim 17 wherein said elastic arm includes a flat spring arm and wherein said recess includes a portion cut out therefrom.

19. The enclosure according to claim 18 wherein said cross member includes that residual portion of said flat spring arm remaining after removal of said cut out portion and nearest to said first case portion as said enclosure is being closed.

20. The enclosure according to claim 12 wherein:
said first clip portion includes a boss; and
said second clip portion includes a recess for receiving, said boss.

21. The enclosure according to claim 13 wherein said elastic arm includes a slot, said wedge being affixed to move within said slot.

22. The enclosure according to claim 13 wherein said elastic arm includes a slot, aid wedge being affixed to move within said slot.

23. The enclosure according to claim 22 wherein:
said first clip portion includes a boss; and
said second clip portion includes a recess for receiving said boss.

24. The enclosure according to claim 14 wherein said elastic arm includes a flat spring arm and wherein said recess includes a portion cut out therefrom.

* * * * *